(12) United States Patent
Liaw et al.

(10) Patent No.: US 8,421,130 B2
(45) Date of Patent: Apr. 16, 2013

(54) METHOD FOR MANUFACTURING SRAM DEVICES WITH REDUCED THRESHOLD VOLTAGE DEVIATION

(75) Inventors: Jhon Jhy Liaw, Hsin-Chu (TW);
Chih-Hung Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 205 days.

(21) Appl. No.: 11/696,353

(22) Filed: Apr. 4, 2007

(65) Prior Publication Data
US 2008/0246094 A1  Oct. 9, 2008

(51) Int. Cl.
*H01L 29/78* (2006.01)

(52) U.S. Cl.
USPC .... 257/288; 257/351; 257/412; 257/E21.409; 257/E27.098; 438/199; 438/525

(58) Field of Classification Search ........... 257/288, 257/412, E27.098, E21.345, E21.409, 351; 438/197, 199, 525, 528
See application file for complete search history.

(56) References Cited

U.S. PATENT DOCUMENTS

| | | | |
|---|---|---|---|
| 5,514,902 A * | 5/1996 | Kawasaki et al. | 257/607 |
| 5,972,783 A * | 10/1999 | Arai et al. | 438/513 |
| 6,214,656 B1 * | 4/2001 | Liaw | 438/199 |
| 6,287,906 B1 * | 9/2001 | Yamashita et al. | 438/199 |
| 6,342,438 B2 | 1/2002 | Yu et al. | 438/520 |
| 6,475,887 B1 * | 11/2002 | Kawasaki et al. | 438/528 |
| 6,521,527 B1 * | 2/2003 | Kuroi et al. | 438/652 |
| 6,743,704 B2 | 6/2004 | Takahashi | 438/559 |
| 6,750,122 B1 * | 6/2004 | Schafbauer | 438/491 |
| 7,972,919 B2 * | 7/2011 | Gray et al. | 438/202 |
| 2006/0263992 A1 * | 11/2006 | Chen et al. | 438/301 |
| 2007/0054444 A1 * | 3/2007 | Shibata | 438/162 |
| 2007/0196988 A1 * | 8/2007 | Shroff et al. | 438/299 |
| 2007/0218661 A1 * | 9/2007 | Shroff et al. | 438/510 |

* cited by examiner

*Primary Examiner* — Tuan N. Quach
(74) *Attorney, Agent, or Firm* — Haynes and Boone, LLP

(57) ABSTRACT

A semiconductor device includes a semiconductor substrate; a gate dielectric layer disposed on the semiconductor substrate; a gate conductive layer doped with impurities selected from nitrogen, carbon, silicon, germanium, fluorine, oxygen, helium, neon, xenon or a combination thereof on the gate dielectric layer; and source/drain doped regions formed adjacent to the gate conductive layer in the semiconductor substrate, wherein the source and drain doped regions are substantially free of the impurities doped into the gate conductive layer. These impurities reduce the diffusion rates of the N-type of P-type dopants in the gate conductive layer, thereby improving the device performance.

10 Claims, 6 Drawing Sheets

METHOD FOR MANUFACTURING SRAM DEVICES WITH REDUCED THRESHOLD VOLTAGE DEVIATION

BACKGROUND

The present invention relates generally to semiconductor processing technology, and more particularly to a method for manufacturing static random access memory (SRAM) devices with reduced threshold voltage deviation.

As semiconductor processing technology advances, integrated circuit (IC) devices continue to shrink in size. In order to reduce short channel effect, the thermal budget and source/drain dopant density are reduced as the size of IC device shrinks. Such low dopant density often causes a depletion region formed between a polysilicon gate layer and its underlying gate dielectric layer. In order to eliminate this depletion region, conventionally, a pre-gate doping step is performed to increase the gate dopant density after the polysilicon gate layer is deposited on the gate dielectric layer. The pre-gate doping is used extensively in manufacturing various IC devices, such as SRAM.

FIG. 1 schematically illustrates a typical SRAM cell 100, which comprises PMOS transistors 102 and 104, as well as NMOS transistors 106, 108, 110 and 112. PMOS transistor 102 and NMOS transistor 106 are serially coupled between a supply voltage Vcc and a device ground, which can be any voltage lower than Vcc. Similarly, PMOS transistor 104 and NMOS transistor 108 are coupled between the supply voltage Vcc and the device ground. The gates of PMOS transistor 102 and NMOS transistor 106 are tied together, and further connected to the drains of PMOS transistor 104 and NMOS transistor 108. Similarly, the gates of PMOS transistor 104 and NMOS transistor 108 are tied together, and further connected to the drains of PMOS transistor 102 and NMOS transistor 106. NMOS transistor 110 is coupled between a node 114 and a bit line BL, whereas NMOS transistor 112 is coupled between a node 116 and a complementary bit line BLB. NMOS transistors 110 and 112 function as pass gate switches that selectively allows the cell 100 to be accessed for read or write operation.

One drawback of the conventional pre-gate doping applied to an SRAM device is that inter-gate diffusion may occur to cause a wide variation of threshold voltages among its memory cells. FIG. 2 illustrates a layout view of the SRAM cell 100 on a substrate and poly silicon level. An area 202 defined by broken lines represents where PMOS transistors 102 and 104 are constructed. The areas outside the area 202 represent where NMOS transistors are constructed. As shown in the drawing, a polysilicon layer 204 extending across the area 202 forms the polysilicon gate layer for both PMOS transistor 102 and NMOS transistor 106, wherein the portion inside the area 202 is doped with P-type impurities and the portion outside the area 202 is doped with N-type impurities in the pre-gate doping process. During a subsequent annealing process, the P-type impurities would diffuse toward the N-type impurities, and vice versa, thereby resulting in a wide variation of threshold voltage among the SRAM cells.

FIG. 3 illustrates a chart showing the sensitivity of the threshold voltage variation to a distance marked by label "A" between an N+ implant region of NMOS transistor 106 and an oxide defined area of PMOS transistor 102. The x-axis of the chart represents the distance in units of nm, and the y-axis represents the threshold voltage variation in units of percentage. As shown in the chart, as the distance "A" decreases the variation of threshold voltage increases. Given that the SRAM devices continuously shrink in size as semiconductor processing technology advances, the problem of threshold voltage variation becomes increasingly serious.

As such, what is needed is a method for manufacturing SRAM devices with reduced threshold voltage deviation.

SUMMARY

The present invention discloses a semiconductor device that includes a semiconductor substrate; a gate dielectric layer disposed on the semiconductor substrate; a gate conductive layer doped with impurities selected from nitrogen, carbon, silicon, germanium, fluorine, oxygen, helium, neon, xenon or a combination thereof on the gate dielectric layer; and source/drain doped regions formed adjacent to the gate conductive layer in the semiconductor substrate, wherein the source and drain doped regions are substantially free of the impurities doped into the gate conductive layer. These impurities reduce the diffusion rates of the N-type of P-type dopants in the gate conductive layer, thereby improving device performance.

The construction and method of operation of the invention, however, together with additional objectives and advantages thereof will be best understood from the following description of specific embodiments when read in connection with the accompanying drawings.

DESCRIPTION

This invention describes a method for manufacturing IC devices, such as SRAM, with reduced threshold voltage deviation. The following merely illustrates various embodiments of the present invention for purposes of explaining the principles thereof. It is understood that those skilled in the art will be able to devise various equivalents that, although not explicitly described herein, embody the principles of this invention.

Figure 1:
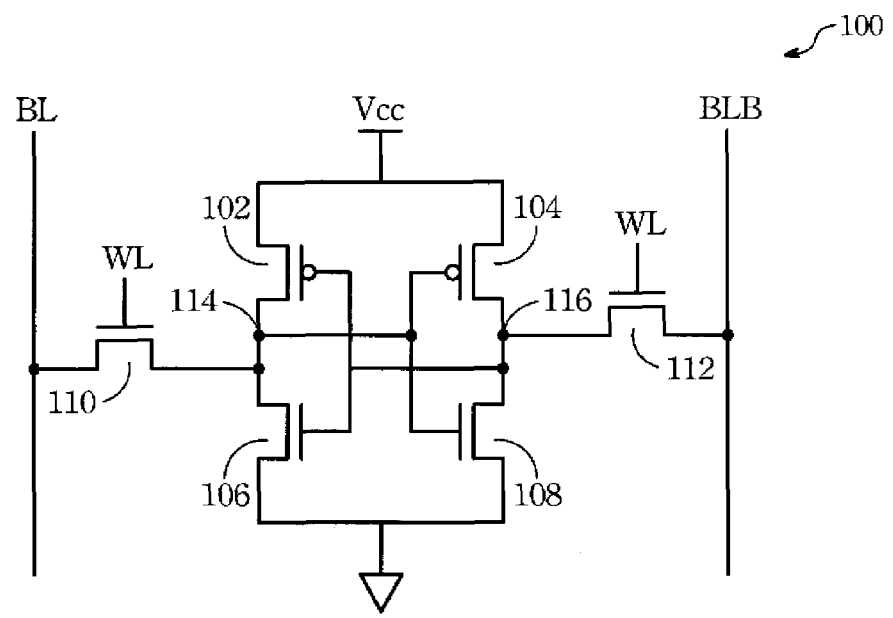
FIG. 1 schematically illustrates a typical six-transistor SRAM cell.
Figure 2:
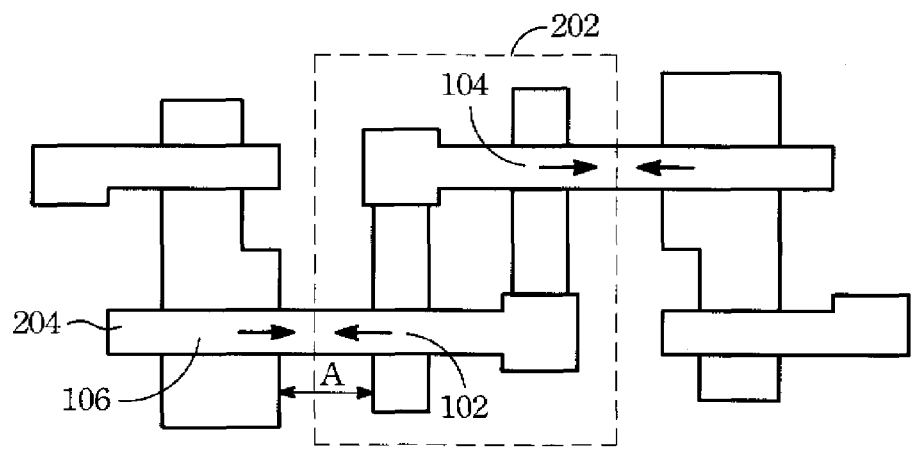
FIG. 2 illustrates a layout view of a typical six-transistor SRAM cell.
Figure 3:
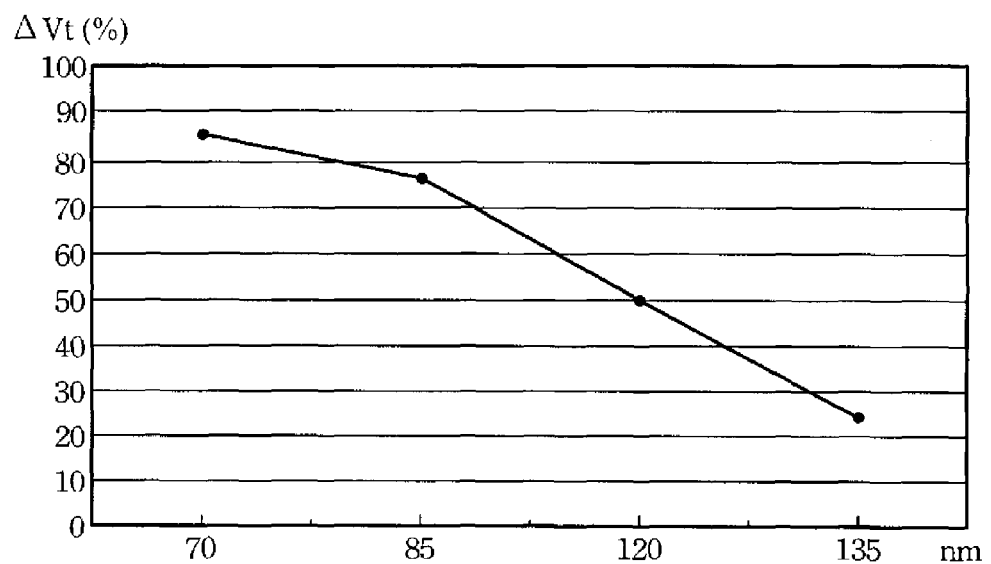
FIG. 3 illustrates a chart showing the sensitivity of the threshold voltage variation to the size of an SRAM cell.
Figure 4:
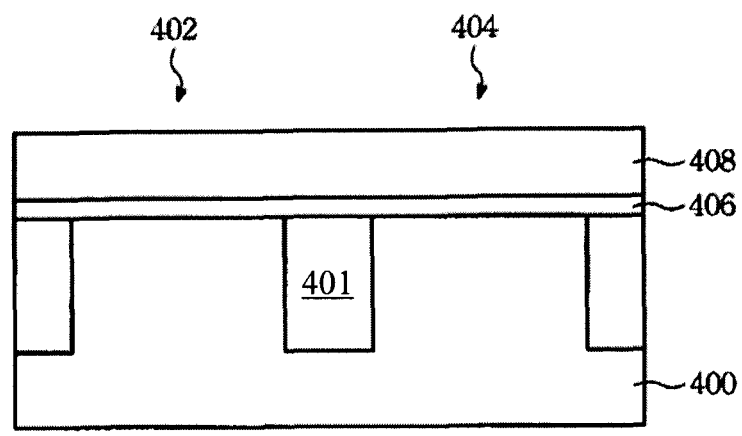
FIGS. 4 through 9 illustrate a set of cross-sectional views of an SRAM cell in a manufacturing process in accordance with one embodiment of the present invention.

FIGS. 4 through 9 illustrate various cross-sectional views of a semiconductor structure during the process of manufacturing an SRAM device in accordance with one embodiment of the present invention. Referring to FIG. 4, a semiconductor substrate 400 having a first device area 402 and a second device area 404 separated by an isolation region 401 is provided. The isolation region 401 can be shallow trench isolation (STI) or local oxidation of silicon (LOCOS). The first area 402 and the second area 404 define the locations for an NMOS transistor functioning as a pull-down device a PMOS transistor function as a pull-up device, respectively. A gate dielectric layer 406 is formed over the first and second areas 402 and 404 on the semiconductor substrate 400. The gate dielectric layer 406 is preferably formed by thermally treating the surface of the semiconductor substrate 400 to produce a thin layer of silicon oxide. The gate dielectric layer 406 can also be made of other materials in other ways. For example, the gate dielectric layer 406 can be made by depositing a layer of silicon oxide using technologies, such as chemical vapor deposition. A layer of gate conductive layer 408 is formed on the gate dielectric layer 406. Although the gate conductive layer 408 is preferably made of poly silicon, it can also be made of other materials, such as tungsten.

Figure 5:
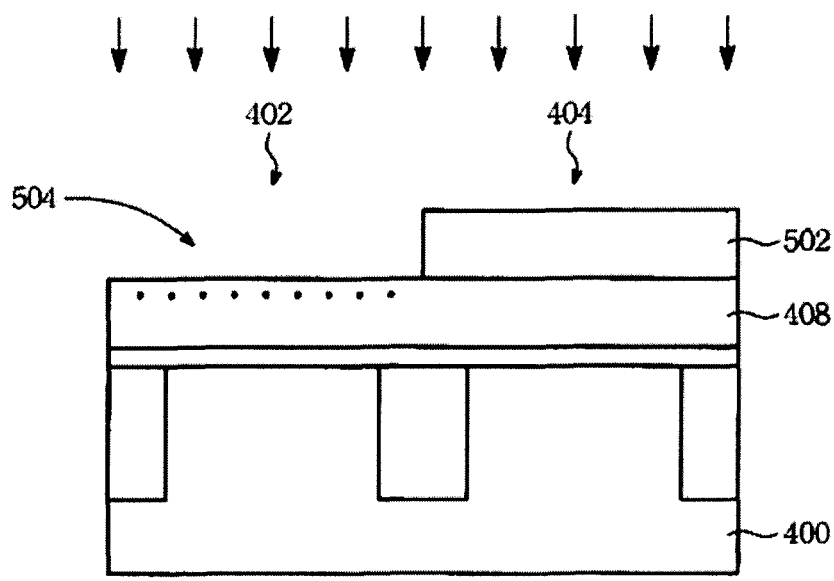

Referring to FIG. 5, a photoresist layer 502 having an opening 504 is formed on the gate conductive layer 408. The photoresist layer 502 covers the second area 404 and exposes the first area 402. An ion implantation process is performed to dope impurities of a first conductivity type into the gate conductive layer 408. In this embodiment, the first conductivity type is N-type, and the impurities can be selected from phosphorus, arsenic, antimony or a combination thereof, with dosage greater than $1 \times 10^{20}$ $cm^{-3}$. The photoresist layer 502 protects its underlying gate conductive layer 408 from being exposed to implanting ions. Thus, the impurities are distributed along the surface of the gate conductive layer 408 in the first area 402, while no significant concentration of impurities can be found in the gate conductive layer 408 in the second area 404.

Figure 6:
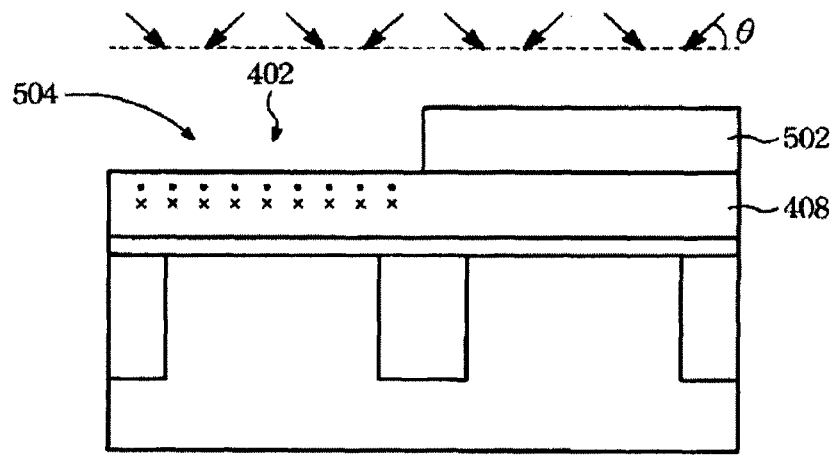

Referring to FIG. 6, anther step of ion implantation is performed to dope impurities other than N-type nor P-type into the gate conductive layer 408 exposed by the opening 504 in the first area 402. The impurities are selected from nitrogen, carbon, silicon, germanium, fluorine, oxygen, helium, neon, argon, xenon or a combination thereof. In this embodiment, the impurities can be implanted with an energy ranging from approximately 500 eV to 100 KeV at dosage greater than $5 \times 10^{19}$ $cm^{-3}$. The impurities can be implanted into the gate conductive layer 408 at an angle ranging from approximately 15 to 75 degrees with respect to the top surface thereof. The photoresist layer 502 protects its underlying gate conductive layer 408 from being exposed to implanting ions. Thus, the impurities are distributed along the surface of the gate conductive layer 408 in the first area 402, while no significant concentration of impurities can be found in the gate conductive layer 408 in the second area 404. In this figure, the N-type impurities are marked as dots and the impurities that are neither N-type nor P-type are marked as crosses. After the ion implantation is completed, the photoresist layer 502 is removed. It is noted that the order of the two ion implantation steps are interchangeable.

Figure 7:
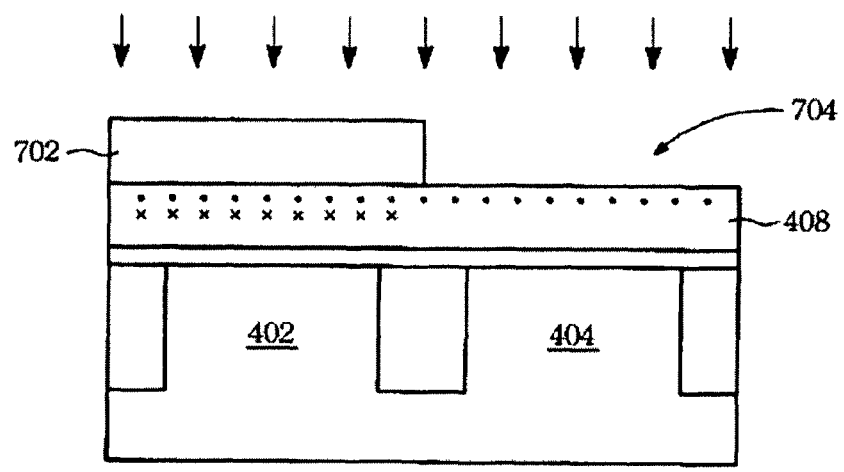

Referring to FIG. 7, a photoresist layer 702 having an opening 704 is formed on the gate conductive layer 408. The photoresist layer 702 covers the first area 402 and exposes the second area 404. An ion implantation process is performed to dope impurities of a second conductivity type into the gate conductive layer 408. In this embodiment, the second conductivity type is the P-type, and the impurities can be selected from boron, boron fluoride, indium or a combination thereof, with dosage greater than $1 \times 10^{20}$ $cm^{-3}$. The photoresist layer 702 protects its underlying gate conductive layer 408 from being exposed to implanting ions. Thus, the impurities are distributed along the surface of the gate conductive layer 408 in the second area 404, while no significant concentration of the P-type impurities can be found in the gate conductive layer in the first area 402.

Figure 8:
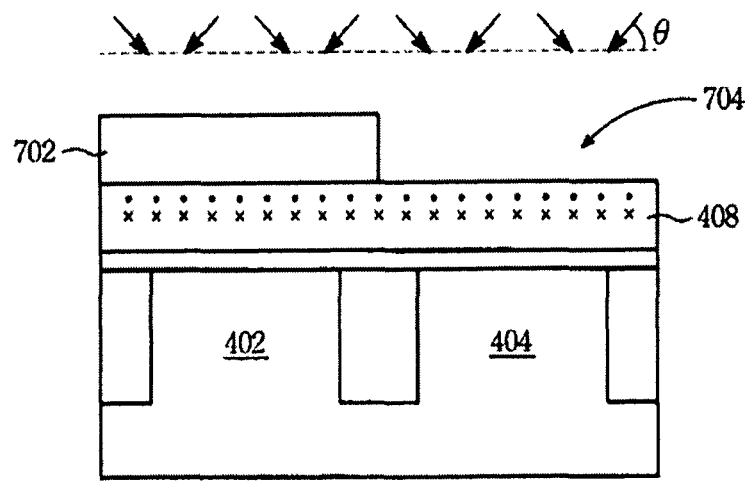

Referring to FIG. 8, yet anther step of ion implantation is performed to dope impurities other than N-type nor P-type into the gate conductive layer 408 exposed by the opening 704 in the second area 404. The impurities are selected from nitrogen, carbon, silicon, germanium, fluorine, oxygen, helium, neon, argon, xenon or a combination thereof, and implanted with an energy ranging from approximately 500 eV to 100 KeV at dosage greater than $5 \times 10^{19}$ $cm^{-3}$. The impurities can be implanted into the gate conductive layer 408 at an angle ranging from approximately 15 to 75 degrees with respect to the top surface thereof. The photoresist layer 702 protects its underlying gate conductive layer 408 from being exposed to implanting ions. Thus, the impurities are distributed along the surface of the gate conductive layer 408 in the second area 404, while no significant concentration of impurities can be found in the gate conductive layer 408 in the first area 402. In this figure, the P-type impurities are marked as dots and the impurities that are neither N-type nor P-type are marked as crosses. After the ion implantation is completed, the photoresist layer 702 is removed. It is noted that the order of the two ion implantation steps are also interchangeable.

The impurities that are neither N-type nor P-type reduce the diffusion rate of the N-type impurities in the first area 402 towards the P-type impurities in the second area 404, and vice versa. Thus, the threshold voltage variation of MOS transistors in an SRAM device can be reduced. Accordingly, the performance and reliability of the device can be improved.

Figure 9:
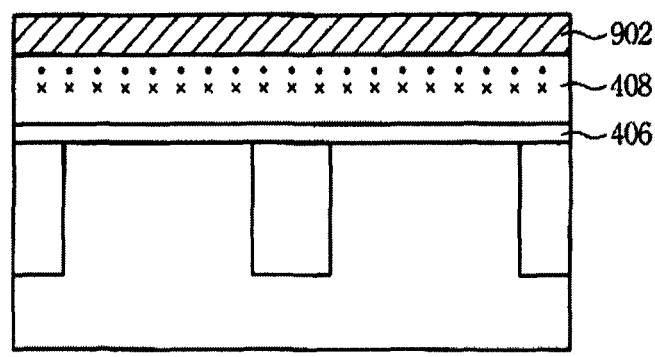

Referring to FIG. 9, the gate dielectric layer 406 and the gate conductive layer 408 are patterned (no shown in this cross-sectional view) to form gate structures for both the NMOS and PMOS transistors that are serially connected in a SRAM cell. A silicide layer 902 is formed on the gate conductive layer and source/drain regions (not shown in this cross-sectional view) in the semiconductor substrate. In one example, the silicide layer 902 can be formed by depositing a metal layer, such as titanium, cobalt, nickel, platinum, molybdenum, or a combination thereof, on the gate conductive layer 408, and then annealing the metal layer. In another example, the silicide layer 902 can be directly deposited on the gate conductive layer 408.

It is noted that the ion implantation steps explained with reference to FIGS. 6 and 8 can be selectively performed. For example, in another embodiment of the present invention, only the ion implantation step explained with reference to FIG. 6 is performed and the step explained with reference to FIG. 8 can be skipped. As another example, the ion implantation step explained with reference to FIG. 6 is skipped and the step explained with reference to FIG. 8 is performed. These alternative embodiments also reduce the diffusion rate of the N-type impurities and the P-type impurities along the gate conductive layer.

It is also noted the order of implanting N-type or P-type impurities is interchangeable. For example, in one embodiment of the present invention, the ion implantation step explained with reference to FIG. 7 can be performed before the ion implantation step explained with reference to FIG. 5.

Figure 10:
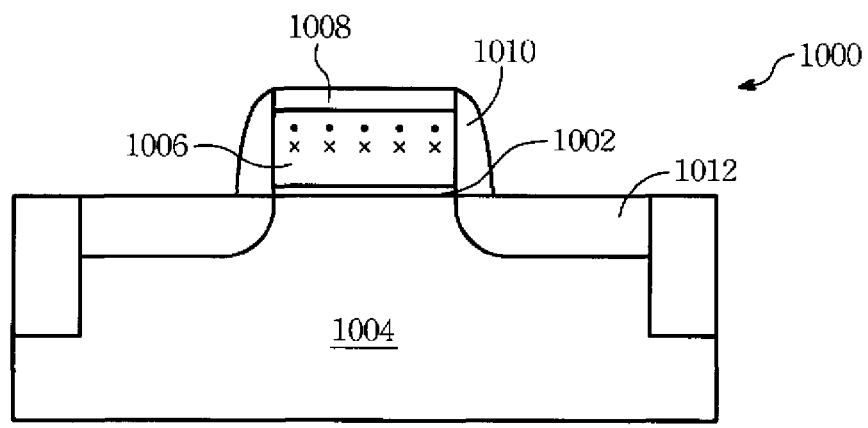
FIG. 10 illustrates a cross-sectional view along of a MOS transistor manufactured by the proposed method in accordance with one embodiment of the present invention.

FIG. 10 illustrates a cross-sectional view along a longitudinal direction of an oxide defined area, showing a profile of a MOS transistor 1000 manufactured by the proposed method in accordance with one embodiment of the present invention. The MOS transistor 1000 is comprised of a dielectric layer 1002, a gate conductive layer 1006, and a silicide layer 1008 on the semiconductor substrate 1004. Spacers 1010 are formed on sidewalls of the dielectric layer 1002, the gate conductive layer 1006 and the silicide layer 1008. Source and drain doped regions 1012 are implanted adjacent to the gate conductive layer 1006 in the semiconductor substrate 1004. In this embodiment, the gate conductive layer 1006 is additionally doped with impurities selected from nitrogen, carbon, silicon, germanium, fluorine, oxygen, helium, neon, xenon or a combination thereof with dosage greater than $5 \times 10^{19}$ cm$^{-3}$, whereas the source and drain doped regions 1012 are substantially free of those impurities. As discussed above, the MOS transistor 1000 can be a PMOS transistor or an NMOS transistor, and the additional impurities can prevent normal P-type or N-type impurities in the gate conductive layer from diffusing across a boundary between two different types of MOS transistors.

Figure 11:
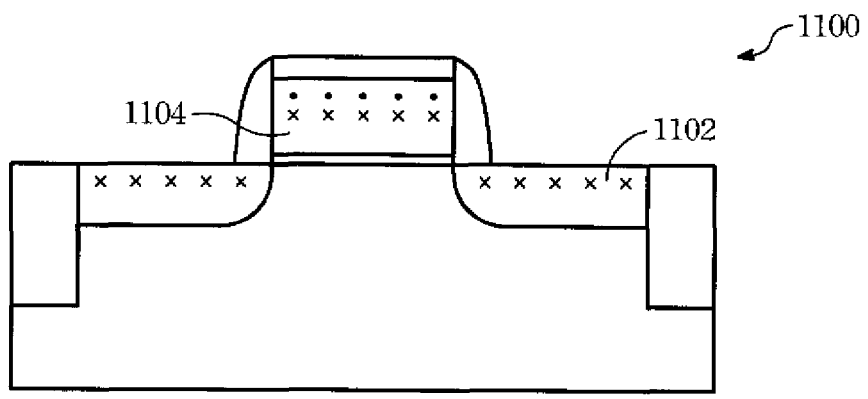
FIG. 11 illustrates a cross-sectional view of a MOS transistor manufactured by the proposed method in accordance with another embodiment of the present invention.

FIG. 11 illustrates a cross-sectional view along a longitudinal direction of an oxide defined area, showing a profile of a MOS transistor 1100 manufactured by the proposed method in accordance with one embodiment of the present invention. The MOS transistor 1100 is similar to the transistor 1000 shown in FIG. 10, except that the source and drain regions 1102 are also doped with impurities selected from nitrogen, carbon, silicon, germanium, fluorine, oxygen, helium, neon, xenon or a combination thereof, with dosage less than half that of the gate conductive layer 1104. For example, if the gate conductive layer 1104 has dosage of approximately $5 \times 10^{19}$ cm$^{-3}$, the dosage of the source and drain regions 1102 will be less than $2.5 \times 10^{19}$ cm$^{-3}$.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor memory device, comprising:
a semiconductor substrate;
at least one isolation layer formed in the semiconductor substrate, the at least one isolation layer separating a first device area and a second device area;
a gate dielectric layer formed over the semiconductor substrate and the at least one isolation layer; and
a conductive gate layer formed over the gate dielectric layer; and
a silicide layer formed over the conductive gate layer, wherein:
the first device area comprises a first MOS transistor comprising:
N-type or P-type impurity ions implanted in the conductive gate layer;
a first dosage of impurity ions other than N-type or P-type implanted in the conductive gate layer;
a source having a second dosage of impurity ions other than N-type or P-type implanted therein, the second dosage being less than half the first dosage; and
a drain having the second dosage of impurity ions other than N-type or P-type implanted therein; and
the second device area comprises a second MOS transistor serially coupled to the first MOS transistor formed in the first device area, comprising:
N-type or P-type impurity ions implanted in the conductive gate layer, wherein the type of impurity ions implanted in the conductive gate layer in the first device area is different than the type of impurity ions implanted in the conductive gate layer of the second device area, and wherein the conductive gate layer is free of the impurity ions other than N-type or P-type in the second device area; and
a source and a drain, the source and drain of the second MOS transistor being free of the impurity ions other than N-type or P-type.

2. The semiconductor memory device of claim 1, wherein the impurity ions other than N-type or P-type implanted in the conductive gate layer in the first device area reduce the diffusion rate of the N-type or P-type impurities in the first device area towards the N-type or P-type impurities in the second device area, and vice versa thereby improving a threshold voltage variation of the first MOS transistor and the second MOS transistor.

3. The semiconductor memory device of claim 1, wherein the N-type impurity ions are selected from phosphorus, arsenic, antimony or a combination thereof.

4. The semiconductor memory device of claim 1, wherein the impurity ions other than P-type or N-type are selected from nitrogen, carbon, silicon, germanium, fluorine, oxygen, helium, neon, xenon or a combination thereof.

5. The semiconductor memory device of claim 1, wherein the P-type impurity ions are selected from boron, boron fluoride, indium or a combination thereof.

6. The semiconductor memory device of claim 1, wherein the first dosage is greater than $5 \times 10^{19}$ cm$^{-3}$.

7. The semiconductor memory device of claim 1, wherein the gate conductive layer has the impurity ions other than N-type or P-type implanted thereinto with energy ranging from approximately 500 eV to 100 KeV.

8. The semiconductor memory device of claim 1, wherein the P-type impurity ions have dosage greater than $1 \times 10^{20}$ cm$^{-3}$.

9. The semiconductor memory device of claim 1, wherein the N-type impurity ions have dosage greater than $1 \times 10^{20}$ cm$^{-3}$.

10. The semiconductor memory device of claim 1, wherein the impurity ions other than N-type or P-type are implanted at an angle between about 15 and 75 degrees with respect to a top surface of the conductive gate layer.

* * * * *